United States Patent [19]
Takeda et al.

[11] Patent Number: 5,512,868
[45] Date of Patent: Apr. 30, 1996

[54] MAGNETOSTATIC MICROWAVE DEVICE HAVING LARGE IMPEDANCE CHANGE AT RESONANCE

[75] Inventors: Shigeru Takeda; Yasuhide Murakami, both of Tottori, Japan

[73] Assignee: Hitachi Metals, Ltd., Tokyo, Japan

[21] Appl. No.: 314,499

[22] Filed: Sep. 28, 1994

[30] Foreign Application Priority Data

Sep. 28, 1993 [JP] Japan .................................... 5-241252

[51] Int. Cl.$^6$ .............................. H01P 7/00; H01P 1/218
[52] U.S. Cl. ........................ 333/219.2; 333/204; 333/263
[58] Field of Search ..................................... 333/201, 202, 333/203, 204, 219, 219.1, 219.2, 245, 246

[56] References Cited

U.S. PATENT DOCUMENTS

| | | | |
|---|---|---|---|
| 4,751,480 | 6/1988 | Kunz et al. ............................. | 333/219 |
| 5,191,308 | 3/1993 | Tsutsumi et al. .......................... | 35/304 |
| 5,371,482 | 12/1994 | Murakami et al. ................... | 333/219.2 |

FOREIGN PATENT DOCUMENTS 85507   3/1994   Japan .

*Primary Examiner*—Benny Lee
*Assistant Examiner*—David H. Vu

[57] ABSTRACT

A magnetostatic wave microwave device comprising a thin magnetostatic wave element and a conductor disposed on the top of said magnetostatic wave element. Because the width of an junction portion of the conductor is larger than the width of an input portion of the conductor, a large impedance change of the magnetostatic wave element at resonance can be obtained while maintaining a Q-value at a high level.

7 Claims, 9 Drawing Sheets

MAGNETOSTATIC MICROWAVE DEVICE HAVING LARGE IMPEDANCE CHANGE AT RESONANCE

BACKGROUND OF THE INVENTION

The present invention relates to a magnetostatic wave microwave device utilizing ferrimagnetic resonance and comprising a magnetostatic wave element and a means for exciting magnetostatic waves, which is used in many microwave components and in particular is used in oscillators.

Recently, as a magnetostatic wave microwave devices for use in a filter, an oscillator, etc. which utilizes ferrimagnetic resonance of a ferrimagnetic thin film, those having a magnetostatic wave element which is produced by forming a ferrimagnetic YIG (yttrium-iron-garnet) thin film on a non-magnetic, single crystalline substrate of GGG (gadolinium-gallium-garnet) by liquid phase epitaxial growth (LPE), etching it by a photolithographic technique and machining the etched film into a desired shape such as circle, rectangle, etc. has been proposed. These magnetostatic wave microwave devices have advantage because they can be made into a microwave integrated circuit using a microstrip line, etc. as a transmission line, and they can be easily connected with other microwave integrated circuits by hybrid junction.

In addition, since a magnetostatic wave element utilizing YIG film can be produced by LPE and machining, it has a high productivity as compared with a conventional magnetostatic wave element utilizing YIG spheres.

However, the performance of a magnetostatic wave microwave device utilizing ferrimagnetic resonance of YIG film is significantly dependent on geometric shape of the YIG film. In order to obtain a large impedance, a YIG film having a large surface area and large thickness is required. However, these large surface area and thickness are disadvantageous from a view point of miniaturizing microwave circuits and maintaining a ferrimagnetic resonance of a large Q-value.

Generally, a circuit, as shown in FIG. 15, in which an LC parallel resonator of concentrated-constant type is connected at a distance d from an input terminal T is an ideal equivalent circuit for magnetostatic wave microwave devices. In order to obtain a large impedance change, the length of the magnetostatic wave element along the propagation direction of microwave has been made longer in the prior art. In this method, however, the length L of the magnetostatic wave element becomes comparable to the wavelength of microwave so that the equivalent circuit in this case is expressed by a distributed constant circuit, as shown in FIG. 16, in which an indefinite number of LC resonators are connected along the direction of L. This corresponds to observing simultaneously a plurality of resonators excited by microwaves of different phases, resulting in failure to obtain a high Q-value of the magnetostatic wave element.

On the other hand, when the length L, width W and thickness t of the magnetostatic wave element are simultaneously made smaller in order to obtain a high Q-value, although a higher Q-value can be obtained, the magnetostatic wave element absorbs very little energy from a microwave. This means that the impedance change at resonance is significantly reduced.

FIG. 12 is a schematic view showing a conventional magnetostatic wave microwave device utilizing a rectangular YIG film. A rectangular, thin magnetostatic wave element 1 is disposed between a ground conductor 3 and a microstrip line 2 which is shorted at the end thereof. An external magnetic field Hext for causing ferrimagnetic resonance is applied perpendicularly to the surface of the magnetostatic wave element 1. Microwaves propagate along the direction of an arrow 4a and are reflected in the direction of an arrow 4b. The reference character Wi means the width of the microstrip and the reference character d means the distance between the edge of the microstrip line 2 and the nearest edge of the magnetostatic wave element 1. In the conventional device, the length L and the width W of the magnetostatic wave element 1 are nearly the same, i.e., the upper surface of the magnetostatic wave element 1 is nearly square. In the prior art, in order to obtain a larger impedance change at resonance measured from the input portion of the microstrip line, L, W and t of the magnetostatic wave element 1 have been simultaneously made longer. However, as mentioned above, increased L, W and t result in reduction of the Q-value of the magnetostatic wave element 1. In contrast, decreased L, W and t lead to reduction of the impedance change at resonance.

FIG. 13 is a schematic view showing a conventional magnetostatic wave microwave device utilizing a circular YIG film. In the conventional magnetostatic wave microwave device, when the outer diameter D and the thickness t of the magnetostatic wave element 1 are made larger in order to obtain a large impedance change at resonance, the Q-value of the magnetostatic wave element 1 is reduced. When D and t are made smaller for obtaining a high Q-value, the impedance change at resonance is reduced.

FIG. 14 is a schematic view showing a conventional magnetostatic wave microwave device having an electrode finger structure 7. This magnetostatic wave microwave device also has the same disadvantages as those in the magnetostatic wave microwave device shown in FIGS. 12 and 13. Namely, when the length L and the thickness t of the magnetostatic wave element 1 are made larger in order to obtain a large impedance change at resonance, the Q-value of the magnetostatic wave element 1 is reduced. On the other hand, when the length L and the thickness t are made smaller for obtaining a high Q-value, the impedance change at resonance is reduced.

FIG. 17 is a schematic illustration showing a magnetostatic wave microwave device in which a right end-shorted microstrip line 2 is disposed with a magnetostatic wave element 1 at a short portion. A wave I with hatched lines shows a standing wave of a microwave current. The microwave current has the maximum magnitude at the short portion. The reference numeral 3 is a ground conductor.

In this device, a larger impedance change of the magnetostatic wave element 1 at resonance can be attained by elongating the sides of the rectangular magnetostatic wave element 1 along the propagation direction of microwave (FIG. 18). The disadvantage in this method has been described above by referring to FIG. 16.

Alternative method for attaining a larger impedance change is to increase the thickness of the magnetostatic wave element 1 (FIG. 19). However, the shape of the magnetostatic wave element 1 is unfavorably deformed from flat spheroid which is regarded as an ideal shape for the magnetostatic wave element 1, thereby resulting in a significantly reduced Q-value of resonance characteristics.

Still another method for attaining a larger impedance change is to make the width (perpendicular to the propagation direction of microwave) of the magnetostatic wave element 1 longer than the length (along the propagation direction of microwave) of the magnetostatic wave element 1 (FIG. 20). However, a greater part of the magnetostatic wave element 1 comes to deviate from the center line of the microstrip line 2 with increasing width so that the coupling between microwave and the magnetostatic wave element 1 is not necessarily sufficient.

OBJECT AND SUMMARY OF THE INVENTION

Accordingly, an object of the present invention is to provide a magnetostatic wave microwave device which can realize a large impedance change at resonance while maintaining a Q-value of a magnetostatic wave element at a high level.

As a result of intense research in view of the above object, the inventors have found that a large impedance change of a magnetostatic wave element at resonance can be attained while maintaining a Q-value at a high level by disposing on a magnetostatic wave element a conductor consisting of a junction portion, a short portion and an input portion, the widths of the junction portion and short portion being larger than that of the input portion. The present invention has been accomplished based on this finding.

The finding by the inventors will be explained more in detail referring to FIG. 21. In order to remove the disadvantage in the prior art (FIGS. 18–20), the width of the junction portion 2b of the conductor on the magnetostatic wave element 1 is selected to be much longer than that of the microstrip line 2. The short portion 2c of the conductor is also selected to be much longer than that of the microstrip line 2. With this structure, the microwave current concentrated in the center line of the microstrip line 2 can be widely distributed to interact with the overall portion of the magnetostatic wave element 1. As a result, the coupling between microwave and the magnetostatic wave element 1 can be increased without a large shift of microwave phase. Further, in a microwave circuit of such structure, a magnetostatic wave element can be regarded as a concentrated constant element throughout a wide frequency range. Therefore, a magnetostatic wave element of a large volume can be used for attaining a large impedance change at resonance while maintaining a Q-value at a high level.

Thus, in an aspect of the present invention, there is provided a magnetostatic wave microwave device comprising a thin magnetostatic wave element and a conductor disposed on the top of said magnetostatic wave element, wherein the conductor consists of an input portion through which microwaves are input, a junction portion at which the conductor is connected to the magnetostatic wave element, and a short portion to be connected to a ground conductor, and wherein each of the input portion, junction portion and short portion has a width perpendicular to a propagation direction of said microwaves and the width of the junction portion is larger than the width of the input portion.

DETAILED DESCRIPTION OF THE PREFERRED EMBODIMENTS

Figure 1:
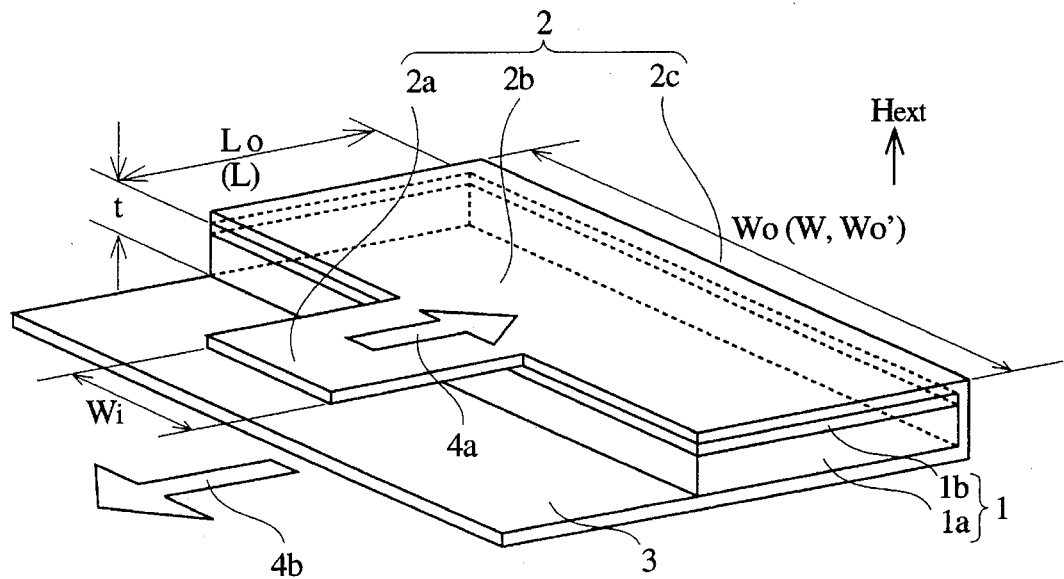
FIG. 1 is a schematic view showing an embodiment of the present invention.

FIG. 1 is a schematic view showing the basic concept of the present invention. In FIG. 1, a rectangular, thin magnetostatic wave element 1 having a thickness t of the order of 300–700 μm consists of a GGG substrate 1a and a YIG film 1b on the top of the GGG substrate 1a. The thickness of the YIG film is preferably 10–100 μm. The reference character L means the length, in the order of 0.2–2 mm, of the magnetostatic wave element 1 along the propagation direction of microwave, and W means the width, in the order of 1–5 mm, perpendicular to the propagation direction, of the magnetostatic wave element 1. A conductor 2 having a thickness of the order of 1–5 μm and located on the magnetostatic wave element 1 consists of an input portion 2a, a junction portion 2b and a short portion 2c. The input portion 2a, the junction portion 2b and the short portion 2c have a width Wi of the order of 0.3–2 mm, a width Wo of the order of 1–5 mm and a width Wo', respectively. The reference numeral 4a means the propagation direction of microwave or the direction of microwave current in the conductor 2. The reference numeral 3 is a ground conductor 3 and the reference numeral 4b means the reflection direction of microwave or the direction of microwave current in the ground conductor 3. The directions 4a and 4b are reversed so that the circuit oscillates. An external magnetic field Hext is applied to the magnetostatic wave element 1 perpendicularly to the surface of the magnetostatic wave element 1 so that ferrimagnetic resonance is caused.

Figure 12:
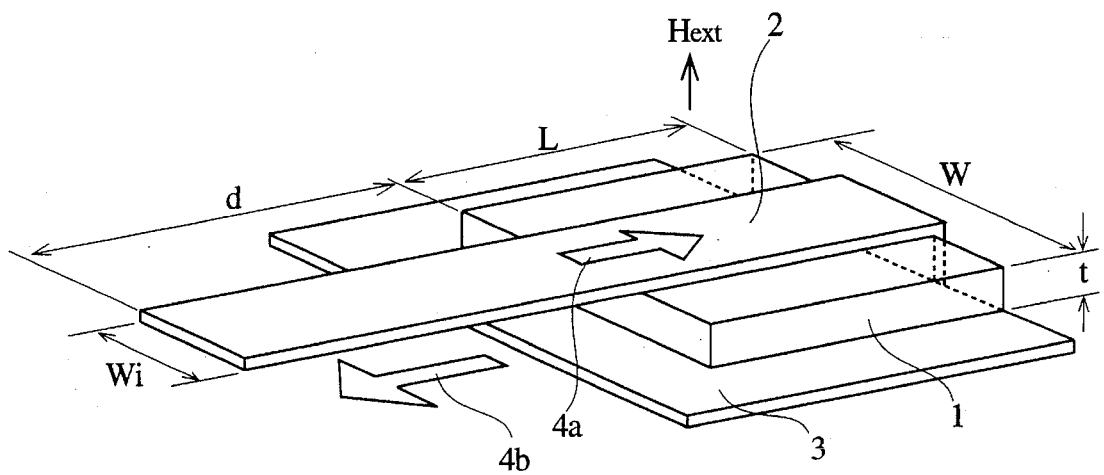
FIG. 12 is a schematic view showing a conventional magnetostatic wave microwave device.
Figure 13:
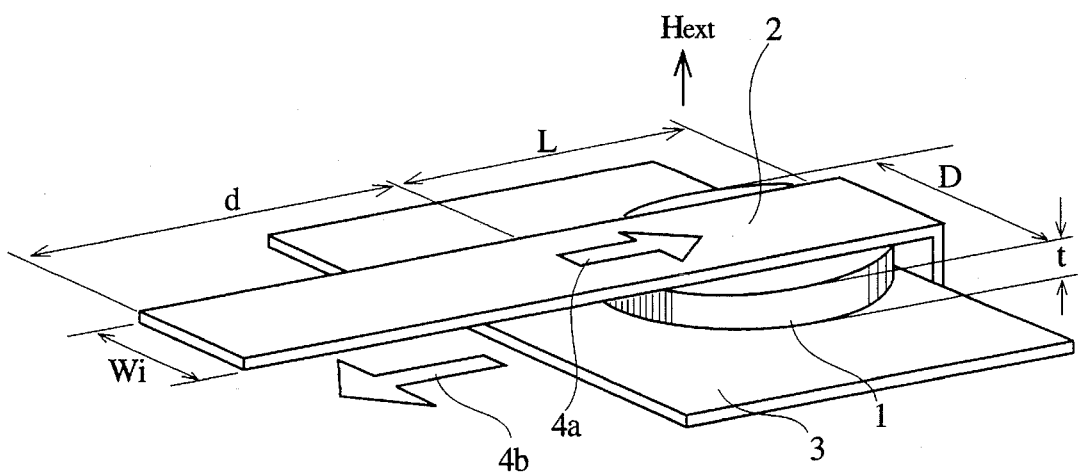
FIG. 13 is a schematic view showing an another conventional magnetostatic wave microwave device.
Figure 14:
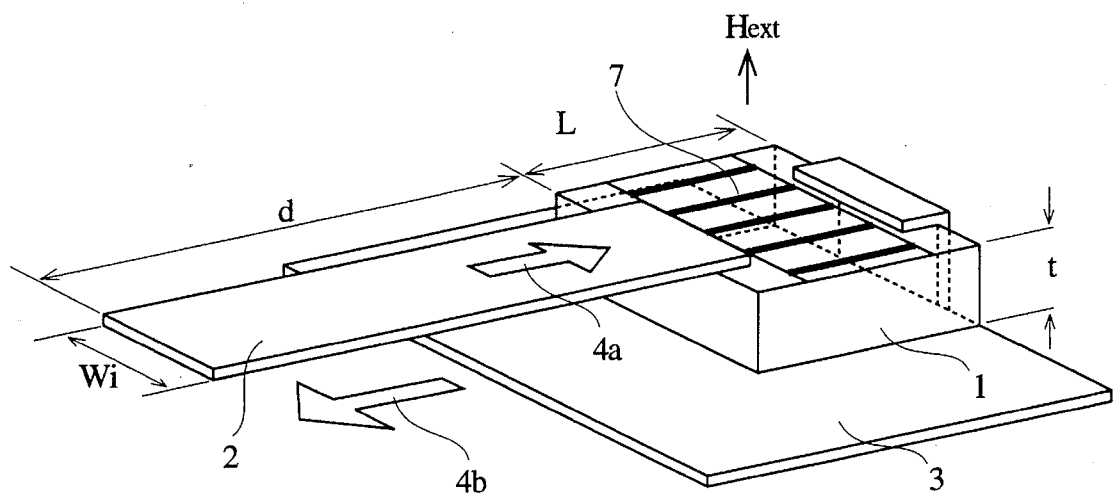
FIG. 14 is a schematic view showing an another conventional magnetostatic wave microwave device.
Figure 15:
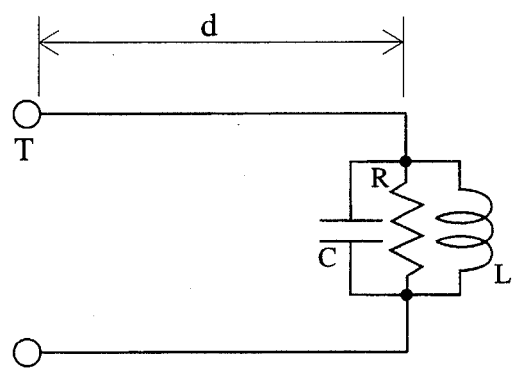
FIG. 15 is a circuit diagram showing an equivalent circuit of a magnetostatic wave microwave device.
Figure 16:
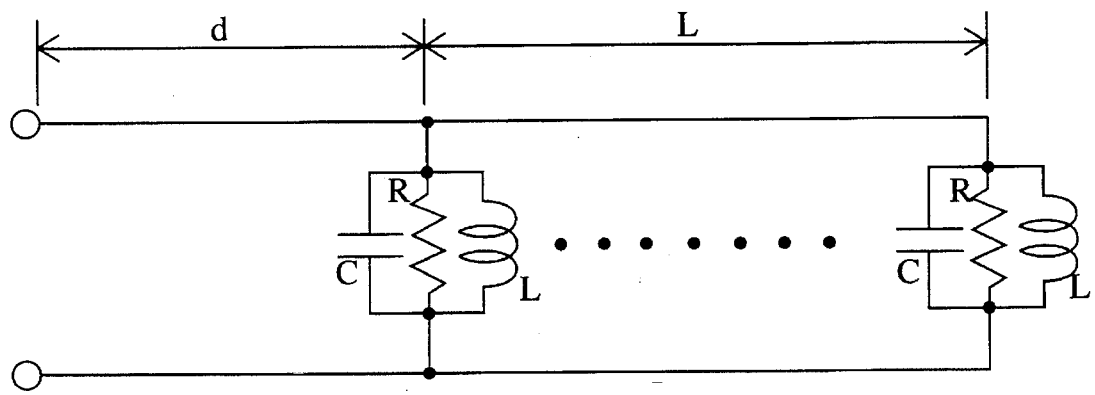
FIG. 16 is a circuit diagram showing an equivalent circuit of another magnetostatic wave microwave device.
Figure 17:
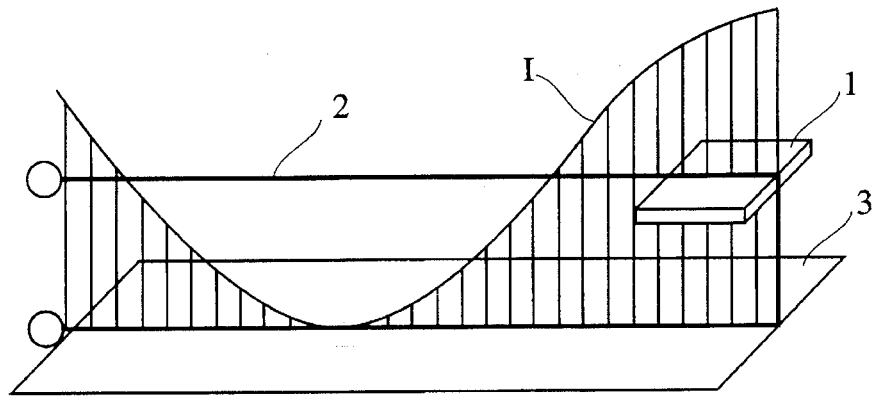
FIG. 17 is a schematic illustration showing a concept of the prior art.
Figure 18:
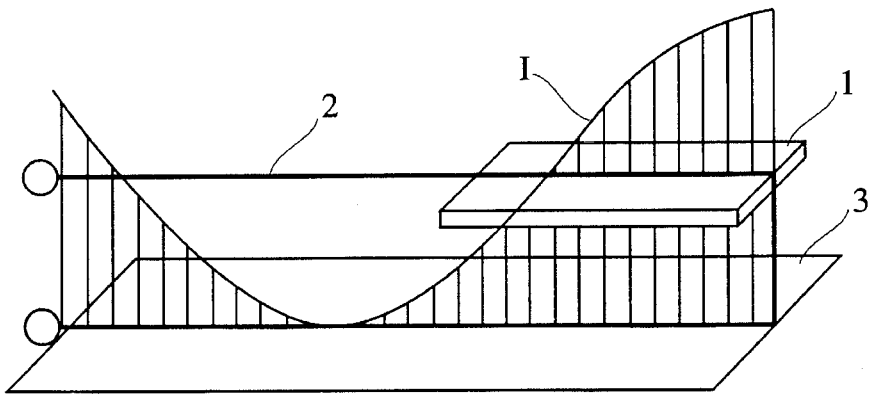
FIG. 18 is a schematic illustration showing a concept of the prior art.
Figure 19:
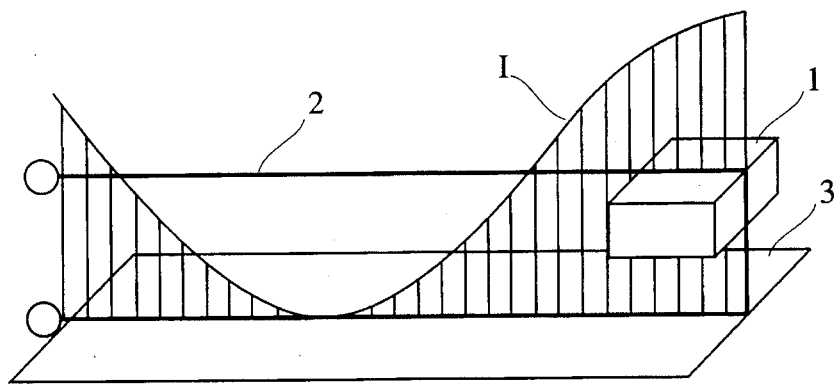
FIG. 19 is a schematic illustration showing a concept of the prior art.
Figure 20:
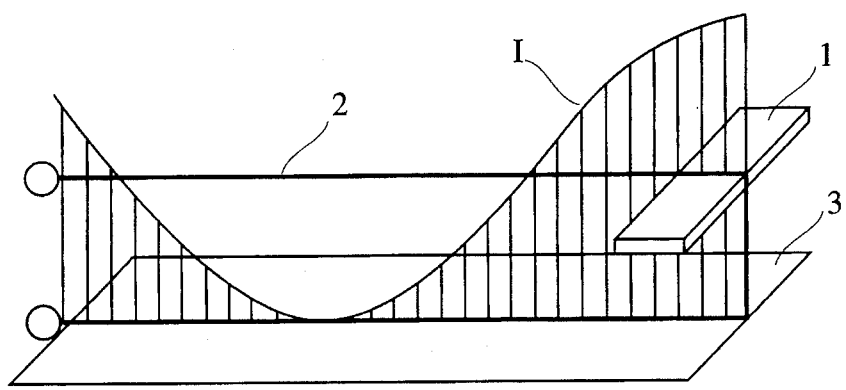
FIG. 20 is a schematic illustration showing a concept of the prior art.
Figure 21:
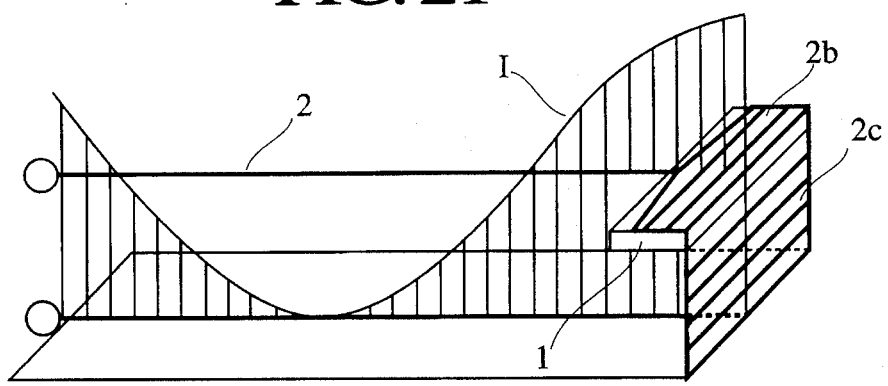
FIG. 21 is a schematic illustration showing a concept of the present invention.

As seen from FIG. 1, in the present invention, the width Wo of the junction portion 2b is much longer than the width Wi of the input portion 2a in contrast with the prior art shown in FIG. 12, etc. In the embodiment shown in FIG. 1, the width Wo and the width Wo' of the short portion 2c are the same. Although the width Wo' may be equal to or nearly equal to the width Wi, it is preferable that the width Wo' is selected to be larger than the width Wi, more preferably to be 1.2–5 times the width Wi. The upper surface of the magnetostatic wave element 1 is rectangular and its longer side (width W) is perpendicular to the direction 4a of the microwave current. In this embodiment, the width Wo and the length Lo of the junction portion 2b are selected to be equal to W and L.

The structure shown in FIG. 1 makes it possible to increase the coupling between the magnetostatic wave element 1 and the junction portion 2b, and to pass microwave to the ground conductor 3 in the electrical length smaller than the length of the short portion 2c because of an electrostatic capacitance between the junction portion 2b and the ground conductor 3. Therefore, the magnetostatic wave element 1 can be regarded to be nearly a concentrated constant element.

Figure 2:
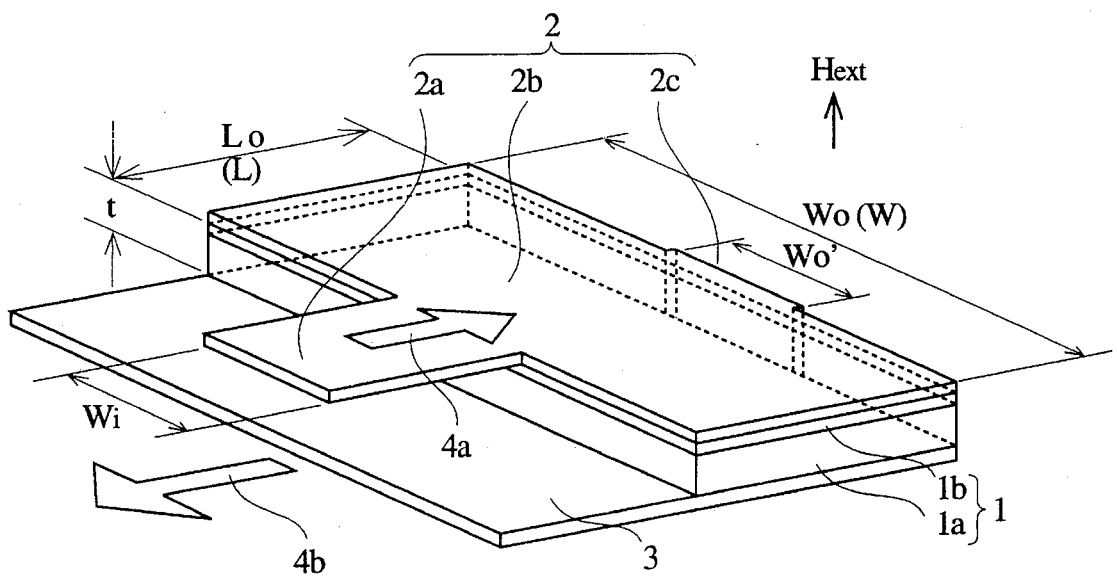
FIG. 2 is a schematic view showing another embodiment of the present invention.

FIG. 2 shows another embodiment of the present invention. The reference characters in common with FIG. 1 have the same meanings. In the embodiment of FIG. 2, the width Wo' of the short portion 2c is selected to be smaller than the width Wo of the junction portion 2b and be nearly equal to the width Wi of the input portion 2a. Although the width Wo' is small, the conductor 2 can be regarded to be electrically shorted with the magnetostatic wave element 1 at the vicinity of the center thereof because of a large electrostatic capacitance between the junction portion 2b and the ground conductor 3. Therefore, the magnetostatic wave element 1 can be regarded as a concentrated constant element.

Figure 3:
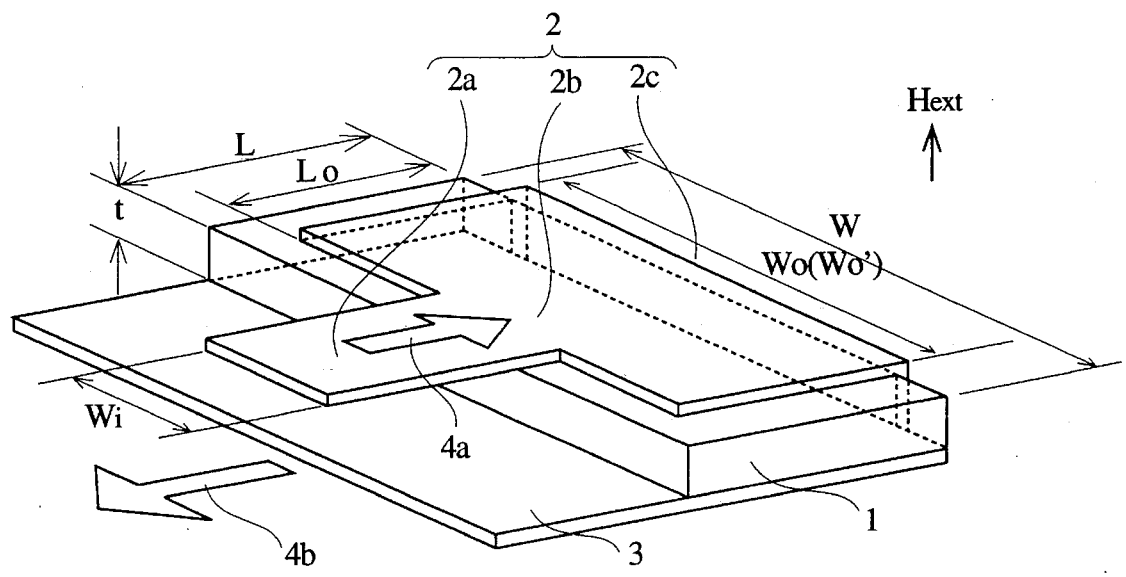
FIG. 3 is a schematic view showing another embodiment of the present invention.

FIG. 3 shows another embodiment of the present invention in which the magnetostatic wave element 1 has a dimension larger than that of the junction portion 2b in both the width and the length. Incidentally, although the magnetostatic wave element 1 consists of a substrate and a ferrimagnetic thin film, these are not shown in FIGS. 3–11 for the purpose of simplification.

Figure 4:
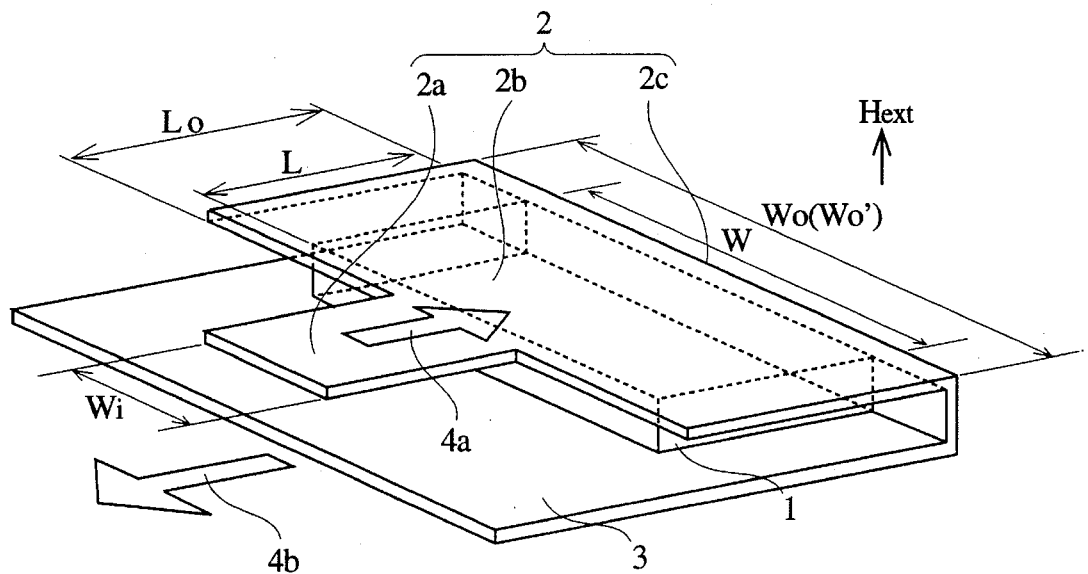
FIG. 4 is a schematic view showing another embodiment of the present invention.

FIG. 4 shows another embodiment of the present invention in which the junction portion 2b has a dimension larger than that of the magnetostatic wave element 1 in both the width and the length.

Figure 5:
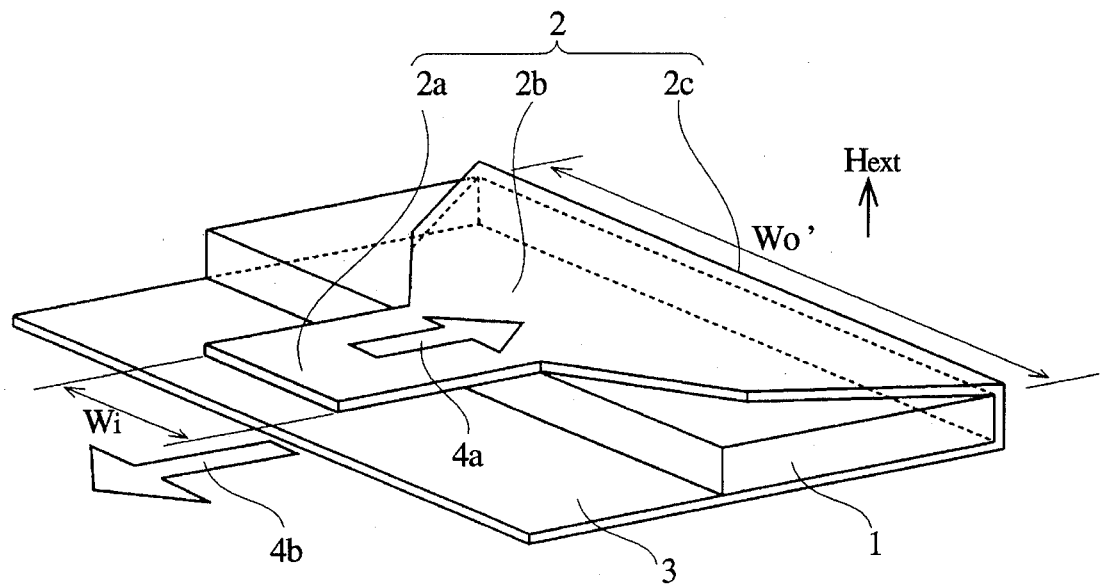
FIG. 5 is a schematic view showing another embodiment of the present invention.

FIG. 5 shows another embodiment of the present invention in which the width of the junction portion 2b become larger as it comes close to the short portion 2c. The device of this structure can also show the effect of the present invention because the width Wo' is larger than the widths of the input portion 2a and the junction portion 2b.

Figure 6:
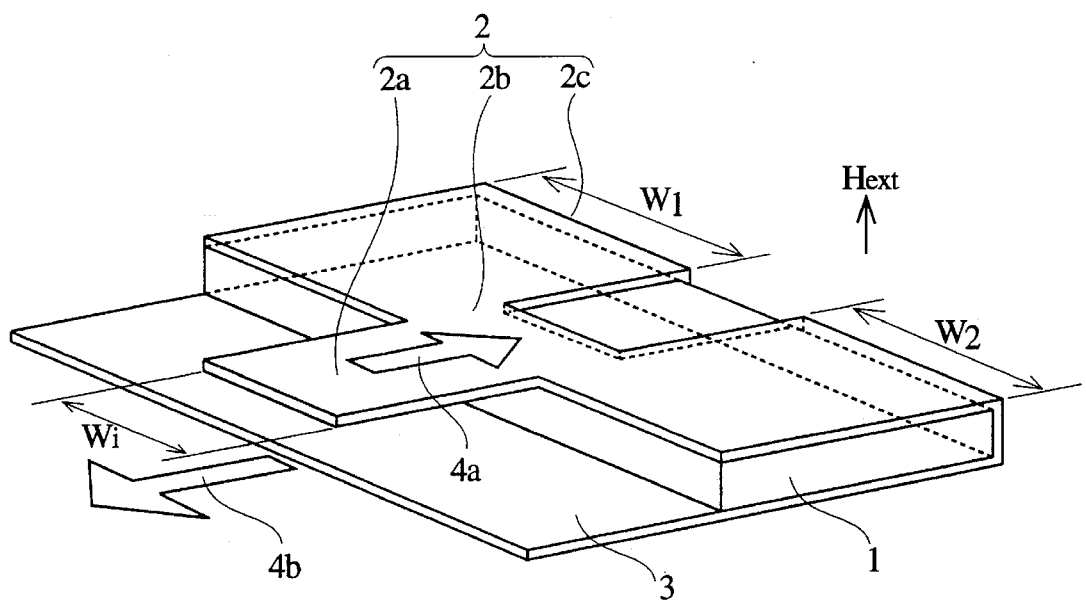
FIG. 6 is a schematic view showing another embodiment of the present invention.

FIG. 6 shows another embodiment of the present invention in which the junction portion 2b and the short portion 2c are separated into two portions. The device of this structure can also show the effect of the present invention as long as the combined width $W_1+W_2$ is larger than the width Wi.

Figure 7:
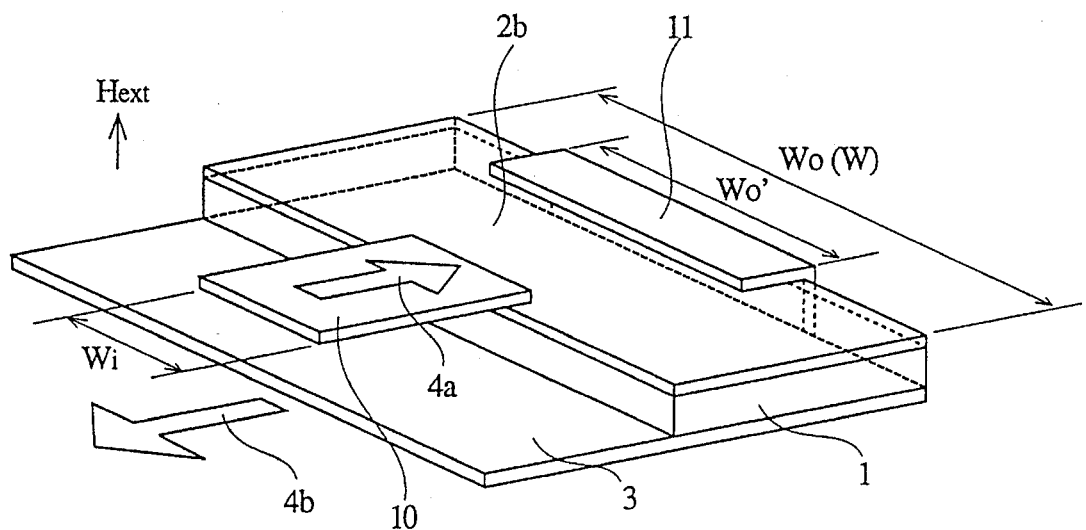
FIG. 7 is a schematic view showing another embodiment of the present invention.

FIG. 7 shows another embodiment of the present invention in which the junction portion 2b is formed on the whole upper surface of the magnetostatic wave element 1 by a thin film-forming process such as sputtering, vapor deposition, etc. A strip line 10 as the input portion and a conductor 11 as the short portion are respectively connected to the junction portion 2b. The width Wo of the junction portion 2b is the same as the width W and is sufficiently larger than the width Wi of the strip line 10 as the input portion. Also, the width Wo' of the conductor 11 as the short portion is selected to be larger than the width Wi. The device of this structure can also show the effect of the present invention.

Figure 8:
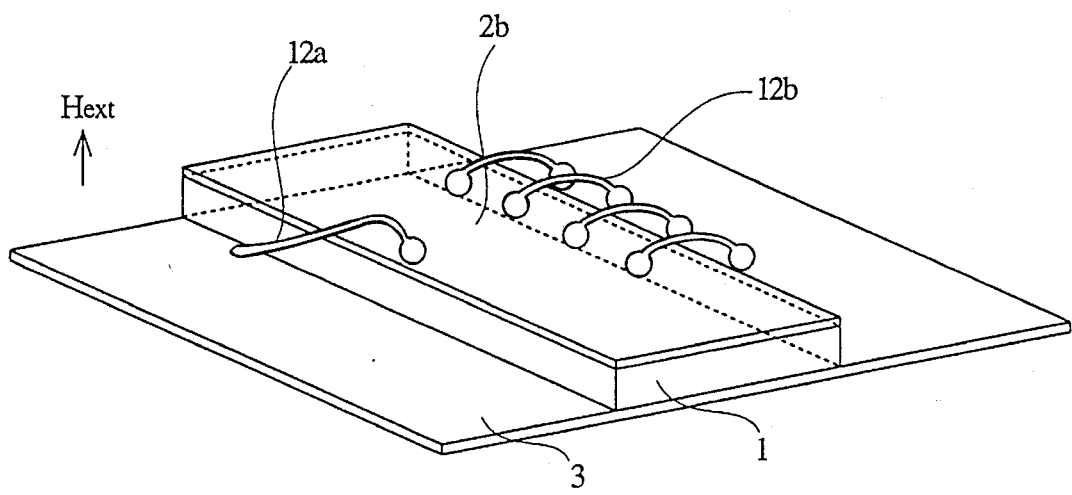
FIG. 8 is a schematic view showing another embodiment of the present invention.

FIG. 8 shows another embodiment of the present invention. In this embodiment, as is the case in FIG. 7, the junction portion 2b is formed on the upper surface of the magnetostatic wave element 1 by a film-forming technique such as sputtering, vapor deposition, etc. As the input portion and the short portion, wire 12a and wires 12b are respectively connected to the magnetostatic wave element 1 by a wire-bonding method. Generally, the surface area of the junction portion 2b is larger than the diameter of the wire 12a. For ensuring a complete short-circuit, the number of the wire 12b is preferred to be larger than that of the wire 12a. Incidentally, the short portion may be formed from a wide ribbon by ribbon-bonding method.

Figure 9:
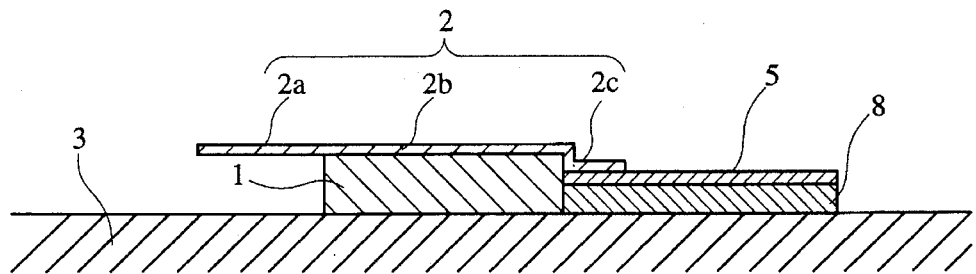
FIG. 9 is a cross-sectional view of another embodiment of the present invention.

FIG. 9 shows a cross-sectional view of another embodiment of the present invention. In this embodiment, the short portion 2c is indirectly connected to the ground conductor 3 through a capacitor 8 for blocking direct current which is placed adjacent to the magnetostatic wave element 1. The reference numeral 5 is a conductor for connecting the capacitor 8 and the short portion 2c. The device of this structure can also show the effect of the present invention.

Figure 10:
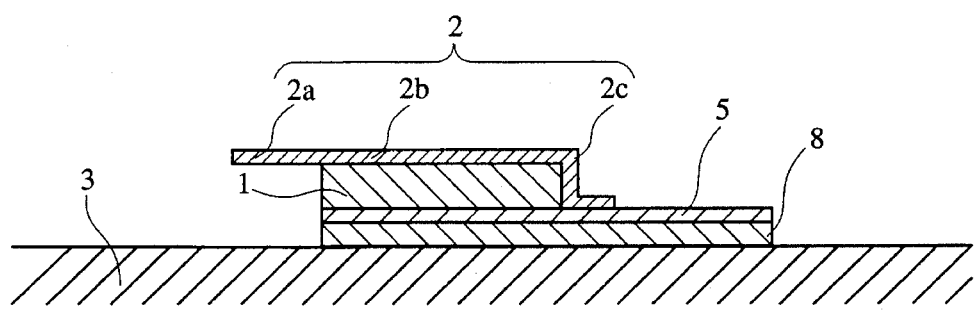
FIG. 10 is a cross-sectional view of another embodiment of the present invention.

FIG. 10 shows a cross-sectional view of another embodiment of the present invention. In this embodiment, the magnetostatic wave element 1 is disposed on the capacitor 8 having a comparatively larger surface area. The short portion 2c is connected to the conductor 5 as is the case in FIG. 9. The device of this structure can also show the effect of the present invention.

Figure 11:
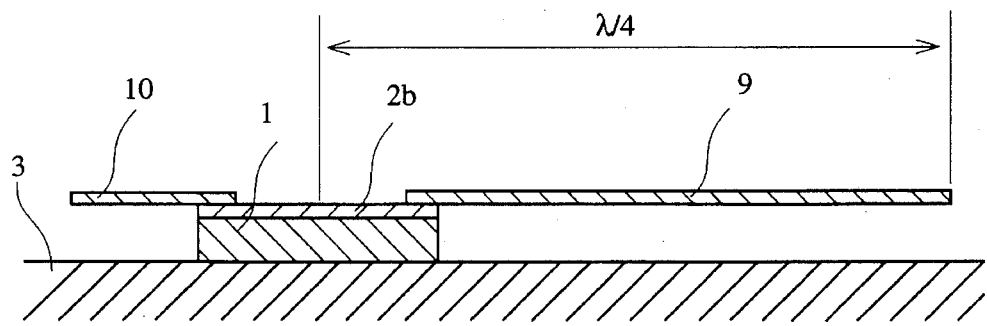
FIG. 11 is a cross-sectional view of another embodiment of the present invention.

FIG. 11 shows a cross-sectional view of another embodiment of the present invention. A strip line 9 is connected to the wide junction portion 2b at one end and the other end thereof is allowed to be open. The electrical length between the center of the wide magnetostatic wave element 1 and the open end of the strip line 9 is selected to be ¼ the wavelength λ of microwave to be used. With this structure, the current in the junction portion 2b has the maximum value always at the center of the junction portion 2b, this state being equivalent to a short-circuited state. The device of this structure can also show the effect of the present invention.

What is claimed is:

1. A magnetostatic wave microwave device comprising a thin magnetostatic wave element and a conductor disposed on the top of said magnetostatic wave element, wherein said conductor consists of an input portion through which microwaves are input, a junction portion at which said conductor is connected to said magnetostatic wave element, and a short portion to be connected to a ground conductor, and wherein each of said input portion, junction portion and short portion has a width perpendicular to a propagation direction of said microwaves and the width of said junction portion is larger than the width of said input portion.

2. The magnetostatic wave microwave device according to claim 1, wherein the width of said short portion is larger than the width of said input portion.

3. The magnetostatic wave microwave device according to claim 1, wherein said thin magnetostatic wave element is a rectangle with longer sides thereof perpendicular to a propagation direction of said microwaves.

4. The magnetostatic wave microwave device according to claim 1, wherein said conductor is formed in closely contact with the top of said magnetostatic wave element by a thin-film forming process.

5. The magnetostatic wave microwave device according to claim 1, wherein said short portion is grounded through a capacitor for blocking direct currents.

6. The magnetostatic wave microwave device according to claim 1, wherein said magnetostatic wave element comprises an thin ferrimagnetic film disposed on the top of a substrate.

7. The magnetostatic wave microwave device according to claim 1, wherein said ferrimagnetic film mainly comprises yttrium-iron-garnet.

* * * * *